(12) United States Patent
Hampel et al.

(10) Patent No.: US 9,767,918 B2
(45) Date of Patent: Sep. 19, 2017

(54) SYSTEM INCLUDING HIERARCHICAL MEMORY MODULES HAVING DIFFERENT TYPES OF INTEGRATED CIRCUIT MEMORY DEVICES

(71) Applicant: Rambus Inc., Sunnyvale, CA (US)

(72) Inventors: Craig Hampel, Los Altos, CA (US); Mark Horowitz, Menlo Park, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 15/282,932

(22) Filed: Sep. 30, 2016

(65) Prior Publication Data

US 2017/0025187 A1 Jan. 26, 2017

Related U.S. Application Data

(63) Continuation of application No. 14/883,916, filed on Oct. 15, 2015, now Pat. No. 9,460,021, which is a
(Continued)

(51) Int. Cl.
*G06F 12/00* (2006.01)
*G11C 29/12* (2006.01)
(Continued)

(52) U.S. Cl.
CPC ........ *G11C 29/1201* (2013.01); *G06F 3/0611* (2013.01); *G06F 3/0614* (2013.01);
(Continued)

(58) Field of Classification Search
None
See application file for complete search history.

(56) References Cited

U.S. PATENT DOCUMENTS 5,359,569 A * 10/1994 Fujita ................. G06F 12/0804
365/185.09
6,170,047 B1 * 1/2001 Dye ...................... G06F 12/08
345/531
(Continued)

FOREIGN PATENT DOCUMENTS

JP 2002-366429 12/2002
JP 2004-502240 A 1/2004
(Continued)

OTHER PUBLICATIONS

EP Examination Report Dated Nov. 12, 2015 for EP Appl. No. 08732464.6. 6 Pages.
(Continued)

*Primary Examiner* — Baboucarr Faal
(74) *Attorney, Agent, or Firm* — Lowenstein Sandler LLP

(57) ABSTRACT

Volatile memory devices may be on a first memory module that is coupled to a memory controller by a first signal path. A nonvolatile memory device may be on a second memory module that is coupled to the first memory module by a second signal path. A memory transaction for the nonvolatile memory device may be transferred from the memory controller to at least one of the volatile memory devices using the first signal path and data associated with the memory transaction is to be written from at least one of the volatile memory devices to the nonvolatile memory device using the second signal path and a control signal. A defect circuit may generate the control signal in view of a detection of a defect in the nonvolatile memory device based on a comparison of a test value read from a memory location to a stored value.

20 Claims, 8 Drawing Sheets

Related U.S. Application Data continuation of application No. 12/529,323, filed as application No. PCT/US2008/057471 on Mar. 19, 2008, now Pat. No. 9,195,602.

(60) Provisional application No. 60/909,359, filed on Mar. 30, 2007.

(51) Int. Cl.

| | | |
|---|---|---|
| G06F 12/08 | (2016.01) | |
| G06F 12/0804 | (2016.01) | |
| G06F 12/0846 | (2016.01) | |
| G06F 13/16 | (2006.01) | |
| G11C 5/04 | (2006.01) | |
| G11C 7/10 | (2006.01) | |
| G11C 29/00 | (2006.01) | |
| G06F 3/06 | (2006.01) | |
| G06F 12/0897 | (2016.01) | |
| G11C 29/32 | (2006.01) | |

(52) U.S. Cl.
CPC .......... *G06F 3/0647* (2013.01); *G06F 3/0688* (2013.01); *G06F 12/08* (2013.01); *G06F 12/0804* (2013.01); *G06F 12/0851* (2013.01); *G06F 12/0897* (2013.01); *G06F 13/1684* (2013.01); *G11C 5/04* (2013.01); *G11C 7/10* (2013.01); *G11C 7/1003* (2013.01); *G11C 29/12* (2013.01); *G11C 29/12015* (2013.01); *G11C 29/32* (2013.01); *G11C 29/76* (2013.01); *G06F 2212/205* (2013.01); *G06F 2212/2022* (2013.01); *G06F 2212/3042* (2013.01); *G06F 2212/608* (2013.01); *G11C 2029/3202* (2013.01); *Y02B 60/1225* (2013.01); *Y02B 60/1228* (2013.01)

(56) References Cited

U.S. PATENT DOCUMENTS

| | | |
|---|---|---|
| 6,625,687 B1 | 9/2003 | Halbert et al. |
| 6,877,079 B2 | 4/2005 | Yoo et al. |
| 7,409,492 B2 | 8/2008 | Tanaka et al. |
| 2002/0013874 A1 | 1/2002 | Gelke et al. |
| 2002/0185337 A1 | 12/2002 | Miura et al. |
| 2006/0095671 A1* | 5/2006 | Gower ................ G06F 12/0802 711/118 |
| 2007/0038831 A1 | 2/2007 | Kim et al. |
| 2009/0157950 A1* | 6/2009 | Selinger ............. G06F 12/0246 711/103 |

FOREIGN PATENT DOCUMENTS

| | | |
|---|---|---|
| JP | 2006-313538 A | 11/2006 |
| WO | WO-99-30240 A1 | 6/1999 |
| WO | WO-02-23355 | 3/2002 |
| WO | WO-2005-038660 A2 | 4/2005 |

OTHER PUBLICATIONS

EP Examination Report dated Dec. 2, 2014 in EP Application No. 08732464.6. 5 pages.
EP Office Action with mail date of Feb. 18, 2010 re EP Appln. No. 08732464.6. 4 Pages.
EP Office Communication dated Mar. 12, 2012 re EP Application No. 08732464.6. 5 pages.
EP Response dated Jan. 27, 2015 in EP Application No. 08732464.6, Includes New Claims (Highlighted and Clear Copies), New Description pp. 1a, 1b, 1c (Highlighted and Clear Copies), and New Drawing Sheets 4/8 to 6/8. 27 pages.
EP Response dated Jan. 7, 2011 to the Official Communication dated Feb. 18, 2010 re EP Application No. 08732464.6. 18 Pages.
EP Response dated Jun. 16, 2010 to the Office Action dated Feb. 18, 2010 re EP Application No. 08732464.6, includes new claims 1-16 (highlighted and clear amendments) and new description pp. 1a, 1 b, 25, 26. 30 Pages.
EP Response to the Official Communication of Mar. 12, 2012, dated Sep. 24, 2012 in EP Application No. 08732464.6-1229. 21 pages.
EP Response with EP Appln. No. 08732464.6 filed on Mar. 21, 2016 in Response to the Official Communication of Nov. 12, 2015. 23 Pages.
Examination Report dated Feb. 18, 2010, European Patent Office, European Patent Application No. 08 732 464.6-1229 filed Aug. 31, 2009, 4 pages.
International Preliminary Report dated Oct. 15, 2009, Patent Cooperation Treaty, International Application No. PCT/US2008/057471 filed Mar. 19, 2008, 11 pages.
JP Decision of Rejection dated May 28, 2013, re JP Application 2010-501086, Includes English Translation. 5 pages.
JP English translation of claims as amended in the Voluntary Amendment and Request for Examination filed Mar. 18, 2011 in JP Application No. 2010-501086. 6 pages.
JP Voluntary Amendment and Request for Examination filed Mar. 18, 2011 in Japanese Application No. 2010-501086.

* cited by examiner

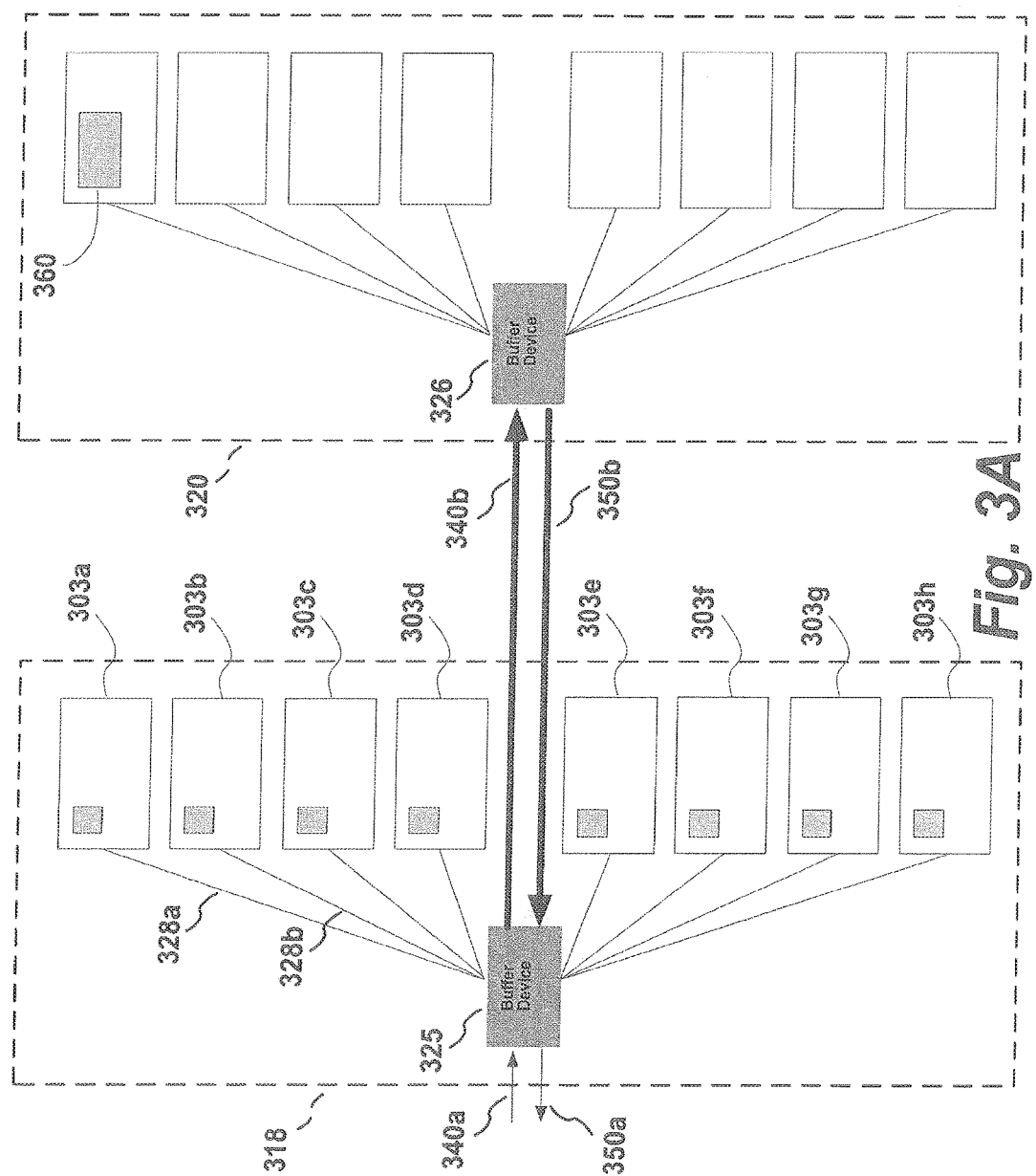

SYSTEM INCLUDING HIERARCHICAL MEMORY MODULES HAVING DIFFERENT TYPES OF INTEGRATED CIRCUIT MEMORY DEVICES

CROSS-REFERENCE TO RELATED APPLICATION

This application is a continuation of U.S. patent application Ser. No. 14/883,916, filed on Oct. 15, 2015, which is a continuation application of and claims priority to U.S. patent application Ser. No. 12/529,323 filed on Aug. 31, 2009, which is a national stage entry of International Application No. PCT/US08/57471 filed on Mar. 19, 2008, which claims priority to U.S. Provisional Application No. 60/909,359 filed on Mar. 30, 2007, each of which is incorporated by reference herein.

FIELD

The disclosure herein generally relates to integrated circuit devices and/or high speed signaling of such devices.

BACKGROUND

There are significant differences in the performance, durability, density, cost and power consumption of various memory technologies and memory systems that implement those memory technologies. While a particular memory technology may have a relatively short latency or read access time, the same memory technology may have a relatively longer write time that may not be suitable for some applications. A particular memory technology may be limited to a relatively low number of write operations to a particular memory location. After exceeding the limited amount of write operations, information may not be reliably stored and retrieved from the memory location. A memory technology may be approximately four to ten times as dense, or occupy a much smaller surface area/volume, than other memory technologies. Some memory technologies cost approximately half as much as others. A variety of voltages or current may be used during memory access operations in different memory technologies that lead to different power consumption rates. Thus, some memory technologies use more power than others.

BRIEF DESCRIPTION OF THE DRAWINGS

Embodiments are illustrated by way of example, and not by way of limitation. In the figures of the accompanying drawing, like reference numerals refer to similar elements.

FIG. 3A illustrates relative data mapping between modules of different hierarchies.

DETAILED DESCRIPTION OF EMBODIMENTS

Figure 1:
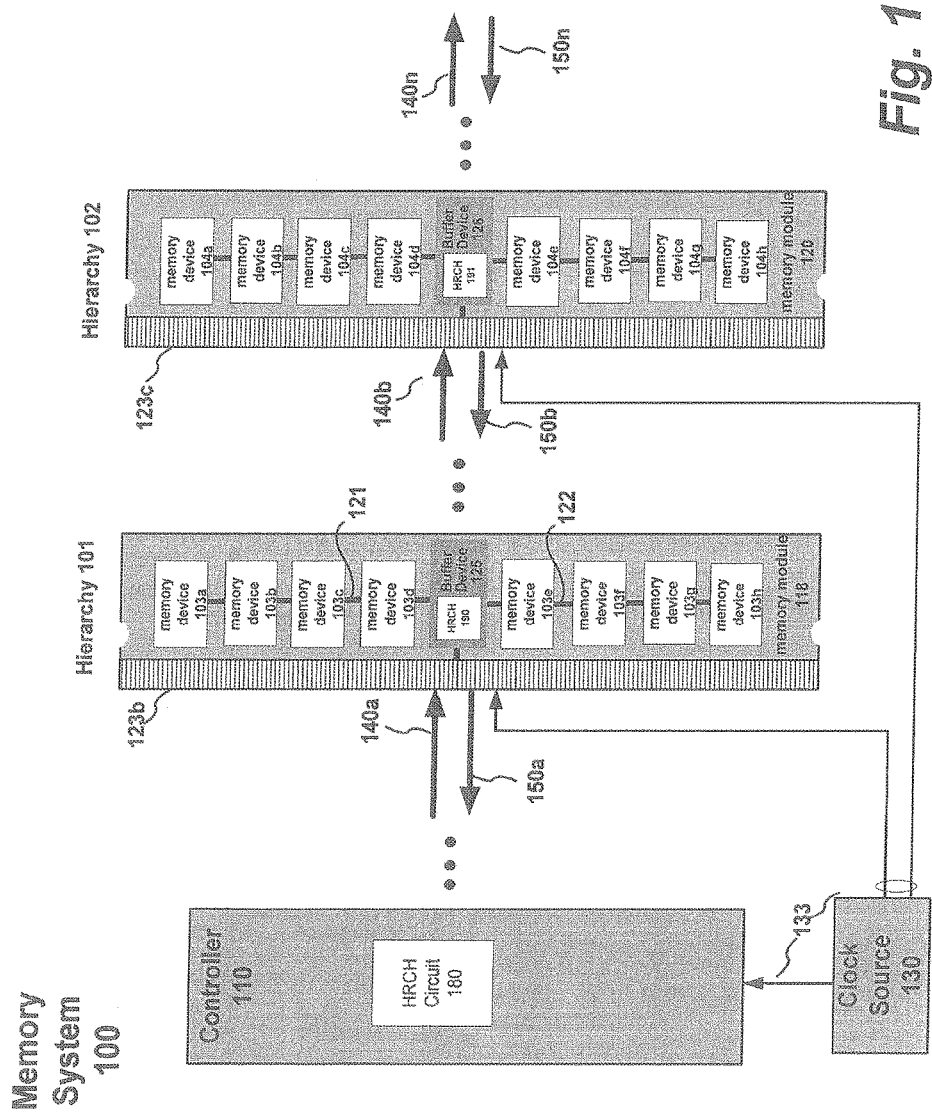
FIG. 1 illustrates a hierarchical memory system organized into logical and physical hierarchies based on memory module placement and device-type.

A memory system, among other embodiments, includes a controller and hierarchies of memory modules having different types of integrated circuit memory devices. A hierarchy (of memory modules) includes one or more memory modules having a particular type of integrated circuit memory device. Hierarchies of memory modules may increase overall system performance as compared to a system having memory modules with a single type of integrated circuit memory device. Overall system read latencies may be reduced and write data durability may be increased by using a first type of integrated circuit memory device in a first hierarchy, while overall cost and power consumption are reduced by using a second type of integrated circuit memory device that costs less and consumes less power in a second hierarchy. For example, at least one volatile memory device is disposed in a first hierarchy and at least one non-volatile memory device is disposed in the second hierarchy so that the first hierarchy may act as a read/write cache for the controller and second hierarchy.

In embodiments, hierarchies are coupled in a daisy chain manner. A first signal path couples a controller to a first memory module having volatile integrated circuit memory devices. A second signal path couples the first memory module to a second memory module having non-volatile memory devices. Control information and write data to be stored in the volatile memory devices are transferred, by the controller, on the first signal path. Control information and write data for the non-volatile memory devices are transferred from the controller onto the first signal path and then onto the second signal path by way of the first memory module. Likewise, read data stored on volatile and non-volatile memory devices are accessed by the controller from the first signal path and the second signal path by way of the first memory module. Control information, read data and write data may be transferred between the first and second signal paths by an integrated circuit buffer device disposed on the first memory module.

Methods of operating a memory system having hierarchies of memory modules include, among other embodiments, buffering/caching a block of write data that has been stored in a second hierarchy in a first hierarchy. The block of write data then may be rewritten (or refreshed/restored) in the second hierarchy by transferring the cached block of write data in the first hierarchy to the second hierarchy in response to a control signal. Read data from the second hierarchy may be transferred in blocks to the first hierarchy while a controller accesses data stored (either read or write data) in the first hierarchy. Write data may be remapped to different memory locations in the hierarchies to distribute and minimize write durability. Write data to be stored in a second hierarchy may be stored in a first hierarchy and read by a controller while a block of write data is transferred from the first hierarchy and stored in the second hierarchy. Write data to be stored in the second hierarchy may be remapped and stored in the first hierarchy or a different memory location in the first hierarchy when a defective memory location is detected.

FIG. 1 illustrates one embodiment of a fully buffered memory system 100 that employs a memory controller 110, a first set of memory devices in the form of a first memory module 118 and a second set of memory devices in the form of a second memory module 120. Respective upstream and downstream signal paths in the form of point-to-point serial links 140*a*, 140*b* and 150*a*, 150*b* couple the controller to the memory modules in a daisy-chained configuration. A clock source 130 distributes a system clock signal to the controller and memory modules.

In an embodiment, the memory controller 110 may be similar to those employed for use with Fully Buffered Dual Inline Memory Modules (FBDIMM), in that it transmits serialized control, address and write data signals, and receives serialized read data signals consistent with the FBDIMM signaling protocol. Generally, this includes transmission circuitry in the form of serial link transmitters to drive multiplexed control, address and write data signals from the controller to the first memory module along the downstream serial link 140a. Receiver circuitry on the controller interfaces with the upstream serial link 150a to receive serialized read data from the first module 118. A hierarchy circuit 180 may be employed by the controller to manage hierarchical activities as will be more fully disclosed below.

With continued reference to FIG. 1, the first memory module 118 includes a buffer device in the form of an integrated circuit (IC) 125, and a plurality of volatile memory devices in the form of dynamic random access memory (DRAM) ICs 103a-h. The buffer IC includes respective pairs of upstream and downstream ports for communicating with the controller 110 and the second memory module 120. In one embodiment, the buffer IC includes a hierarchy circuit 190 that may supplement or substitute for the controller hierarchy circuit 180. The buffer IC communicates with the DRAM devices via respective control/address and data busses (shown for clarity as a single bus). The DRAM devices may be of the XDR(n) type, or DDR(n) type, generally typified by very fast read and write times and high density.

Further referring to FIG. 1, the second memory module 120 is similar to the first memory module 118, with a buffer IC 126 and a plurality of memory devices 104a-h. However, the memory devices for the second module are of the nonvolatile type, such as flash memory. Flash devices are characterized by low cost, low power, high density, and are capable of reading data at rates similar to DRAM. However, write operations to a flash device typically involve erase times that often take milliseconds to complete. Moreover, flash devices have a limited endurance in terms of data writes to the same storage blocks. To address this, the buffer IC includes circuitry that optimizes write operations to the nonvolatile devices, as will be more fully described below.

In an embodiment, the first and second modules 118 and 120 are interconnected via the respective buffer ICs in a point-to-point daisy chain fashion via the upstream and downstream serial links 140 and 150. In this manner, data necessarily flows through the first module 118 in any transaction involving the controller 110 and the second module 120. By positioning the set of volatile memory devices closer to the controller than the set of nonvolatile devices, respective first and second level hierarchies may be defined at 101 and 102.

To support operation of the system in accordance with the hierarchies defined by the position and device-type of each module, the buffer ICs 125 and 126 for the volatile and nonvolatile memory modules include logic to assist the memory controller 110 in coordinating transactions, as described more fully below.

Figure 2A:
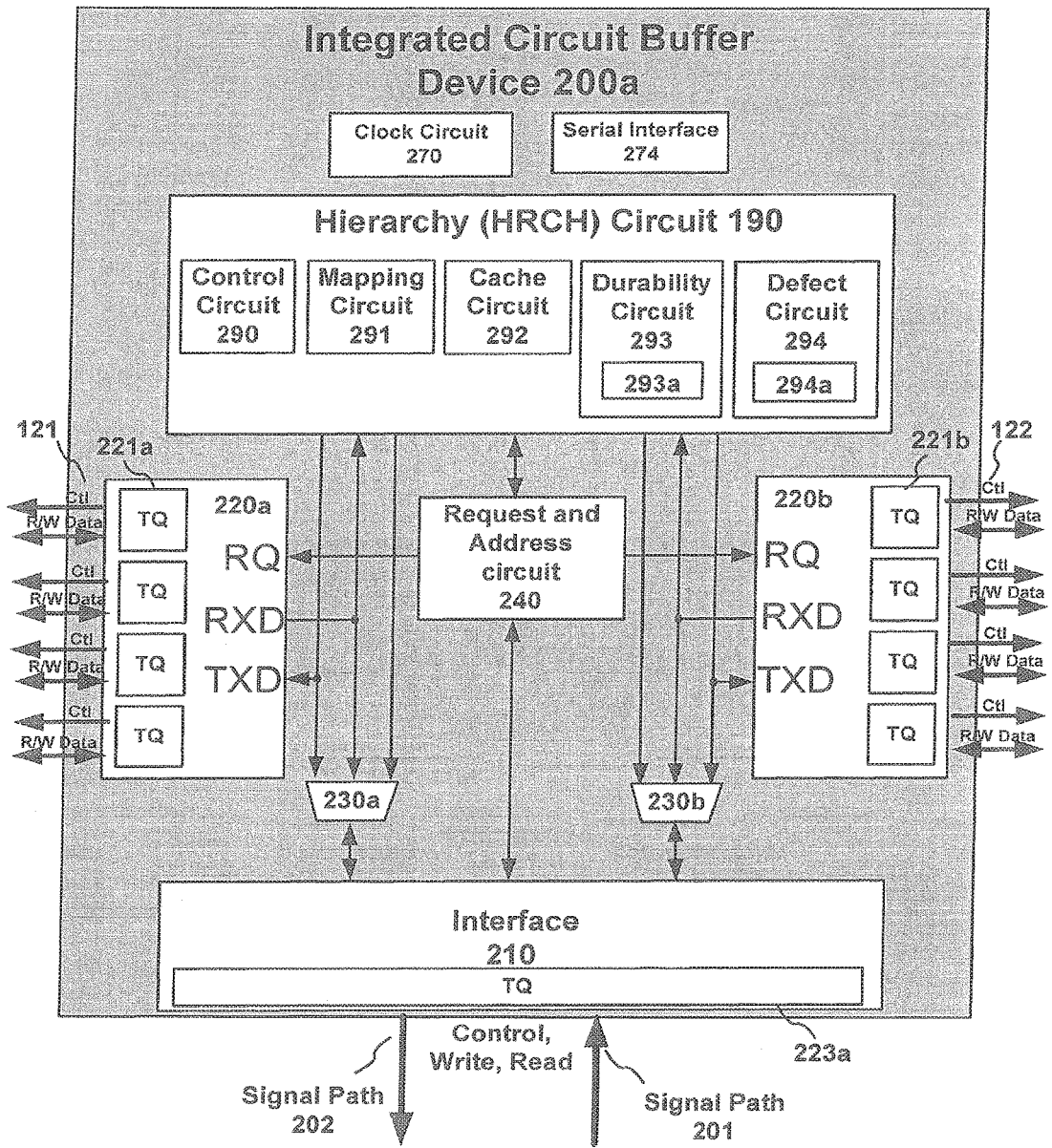
FIG. 2A illustrates an integrated circuit buffer device having a hierarchy circuit.

FIG. 2A illustrates an IC buffer device 200a having an HRCH circuit 190 in an embodiment. IC buffer device 200a corresponds to the buffer device 126 shown in FIG. 1, and employed by one or more nonvolatile memory modules 120. In alternate embodiments, one or more circuits of HRCH circuit 190 may be disposed in controller 110 or distributed between controller 110 and IC buffer device 126. IC buffer device 200a may be disposed on a memory module, housed in a common package along with IC memory devices or dies, or situated on a motherboard, for example, main memory in a personal computer or server. The IC buffer device 200a may also be used in an embedded memory subsystem, for example such as one found on a computer graphics card, video game console or a printer.

With continued reference to FIG. 2A, an interface 210 is shown that receives control information, write data and read data from signal path 201 and outputs control information, write data and read data to signal path 202 to either non-volatile (associated with the second level hierarchy) or volatile integrated circuit memory devices (associated with the first level hierarchy). In an embodiment, signal path 201 corresponds to signal paths 140a-b shown in FIG. 1, while signal path 202 corresponds to signal paths 150a-b. In an embodiment, a multiplexed combination of control information, write data and read data intended for integrated circuit memory devices coupled to IC buffer device 200a is received via interface 210, which may, for example extract the control information. For example, memory commands and address information may be decoded and separated from multiplexed information on signal path 210 and provided to request and address circuit 240 from interface 210. Write data may be provided to interfaces 220a-b by way of interface 210 and read data from integrated circuit memory devices may be received at one or more interfaces 220a-b and provided to interface 210 via multiplexers 230a-b.

Interfaces 220a-b are shown as separate interfaces but could be combined. They contain transaction queues 221a-b that are used to store data that is being sent to or received from the nonvolatile memory devices. In the case of buffer 200a being applied to nonvolatile memory devices, the transaction queues store a transaction and direct the data to a single or limited number of memory devices. This data organization allows a transaction to be serviced by writing only a few memory devices as opposed to all of the devices, thus decreasing the number of write operations being performed by a transaction. Data being sent to and from the memory devices is forwarded to a transaction queue 223a in interface 210 before being sent to the upstream and downstream serial interfaces. Similarly transactions that are received serially from signal path 201, are stored in the transaction queue 223a and then forwarded to transaction queues 221a-b in interfaces 220a-b before being sent to the memory devices. In this organization a single transaction on the serial interface 210 connected to the upstream and downstream links gets mapped to only one or two of the nonvolatile memory devices connected to signal path 121 and 122.

In an embodiment, a clock signal and other information, are received on signal path 201 or by other signal paths, such as a serial bus. In an embodiment, interface 210 includes a transmit circuit or transmitters and a receiver circuit or receivers (or in combination referred to as transceivers) to output signals on signal path 202 and receive signals on signal path 201. Similarly, interfaces 220a and 220b receive and transmit control information, read data and write data to and from integrated circuit memory devices via signal paths 121 and 122, respectively. In an embodiment, interfaces 220a-b include transmitters and receivers to output and receive signals on signal paths 121 and 122. In embodiments, transmitters and receivers in interfaces 210 and 220a-b, singly or in combination, are dedicated to or shared with particular signal lines in signal paths 121 and 122.

In an embodiment, transmitters and receivers in interfaces 220a-b transmit and receive signals having a standard volatile memory device signaling characteristic (or protocol), such as a Synch Nand or Nor FLASH write/read/erase/control signals.

In an embodiment, interfaces 220a-b include transmitters to transfer control information on a unidirectional signal path, while transmitters and receivers for write and read data transfer the write and read data on a bidirectional signal path. In an embodiment, transmitters in interfaces 220a-b and 210 singly or in combination, are output driver circuits to output respective signals onto signal paths 121, 122 and 401. The output driver circuit may be pull-up, pull-down and/or push-pull type output driver circuits.

According to an embodiment, multiplexers 230a and 230b perform bandwidth-concentrating operations, between interface 210 and interfaces 220a and 220b, as well as route data from an appropriate source (i.e., target a subset of signal paths, internal data cache-cache circuit 292) to an appropriate destination. In an embodiment, bandwidth concentration involves combining the (smaller) bandwidth of each signal path in a multiple signal path embodiment to match the (higher) overall bandwidth utilized in a smaller group of signal paths. Bandwidth concentration typically utilizes multiplexing and demultiplexing of throughput between the multiple signal paths and smaller group of signal paths. In an embodiment, IC buffer device 200a utilizes the combined bandwidth of interfaces 220a and 220b to match the bandwidth of interface 210.

Figure 4:
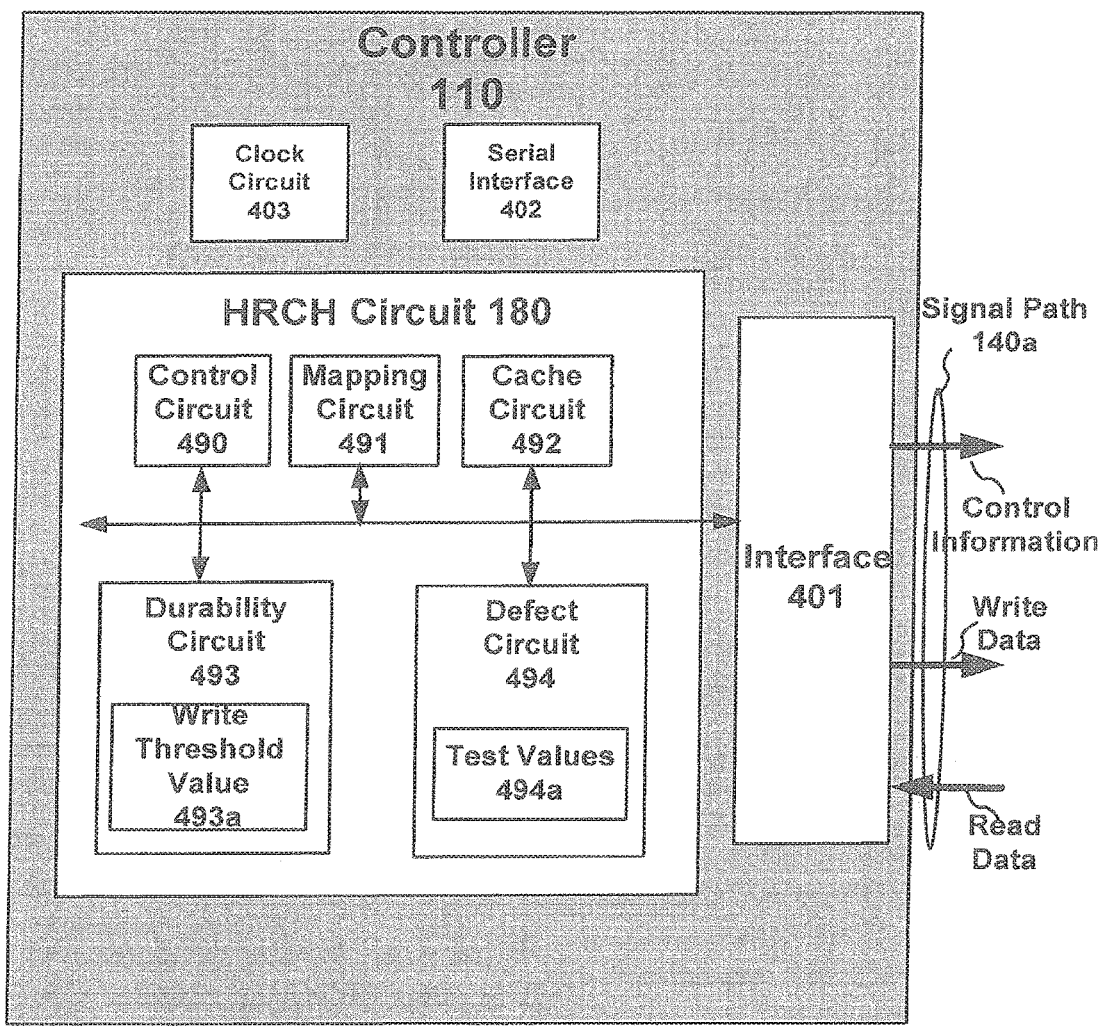
FIG. 4 illustrates a controller having a hierarchy circuit.

Further referring to FIG. 2A, in one embodiment the HRCH circuit 190 includes control circuit 290, mapping circuit 291, cache (or storage) circuit 292, durability circuit 293 (including one or more stored write threshold values 293a) and defect circuit 294 (including one or more stored defect memory addresses), singly or in combination. Circuits shown in IC buffer 200a may be coupled as shown in FIG. 4. Also, one or more circuit components of HRCH circuit 190 may be disposed in controller 110, in particular HRCH circuit 180, rather than in HRCH circuit 190 in various embodiments.

Control circuit 290 is responsible for providing and receiving control signals from and to circuits in HRCH circuit 190. In an embodiment, control circuit 290 may receive control signals and/or values from an interface 210 via signal path 201. Control information may be provided in the form of a command from a controller 110, programmable circuit (such as an SPD device) and/or another memory module. In an embodiment, control circuit 290 is a processor, controller unit and/or control logic. Control circuit 290 is coupled to other circuits in HRCH by way of a signal path similarly to signal path 405 shown in FIG. 4. Read data, write data, and addresses as well as control signals may be transferred between circuits using the signal path. In an embodiment, control circuit 290 also operates IC buffer device 200a and may include a compression/decompression engine.

Figure 3B:
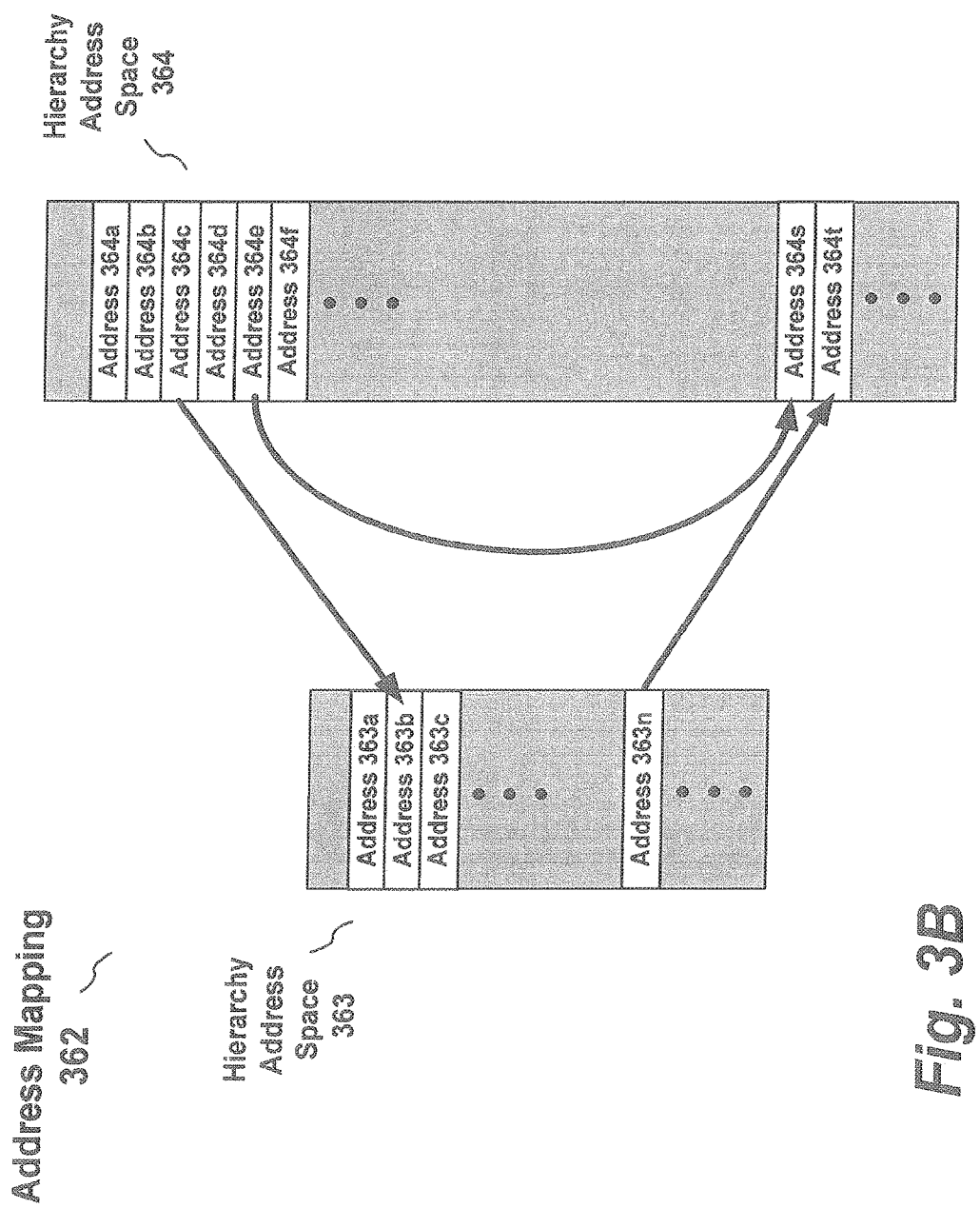
FIG. 3B illustrates relative data mapping between modules of different hierarchies.

Mapping circuit 291 is responsible for remapping or reassigning addresses or memory locations associated with write/read data. Mapping circuit 291 in response to control signals from control circuit 290 (and/or durability and defect circuits 293 and 294) remaps addresses and data as illustrated in FIGS. 3A-B. In an embodiment, mapping circuit 291 may include an address translator circuit. Mapping circuit 291 may remap addresses that are stored along with associated read/write data in cache circuit 292. Mapping circuit 291 directs data from interface 210 to the appropriate transaction queues in interfaces 220 and translates address received from interface 210 into the appropriate device select and memory address to be sent to interface 220a-b. Generally in a volatile memory system a single transaction from interface 210 is directed to one or a few memory devices to reduce the number of write operations required and consecutive address on interface 210 are directed to consecutive locations in a single memory device.

Cache circuit 292 is used to store read/write data from a controller or another memory module. In an embodiment, the read/write data is stored along with associated addresses to memory locations in system 100. Read/write data may be stored and assembled into groups of contiguous words or bytes, such as 64, 128, 256 and/or 512 Kbyte blocks. These blocks then may be transferred and stored as a group. For example, a 256 Kbyte block of write data may be stored in cache circuit 292 of buffer device 125b (which was received from controller 110 via signal paths 140a and 140b) and transferred to memory module 120c via signal path 140c where the write data is stored (or in an embodiment restored after a previous write). In another embodiment, integrated circuit memory devices associated with a particular memory module are used to store blocks of data instead of cache circuit 292.

Durability circuit 293 is responsible for determining whether write/read data should be remapped based on the number of write operations that have occurred at a particular memory location (or plurality of memory locations) in system 100. In an embodiment, durability circuit 293 includes a storage circuit, such as one or more registers that store a write threshold value or limit the number of writes to a particular memory location before further writes or storage at that location may not be reliable. In an embodiment, durability circuit 293 also includes a counter to count the number of writes to particular memory locations and a compare circuit to compare a count value with a stored write threshold value. The compare circuit, in response to the comparison, then may output a control signal to the control circuit 290 indicating that a particular memory location should not be written to. Mapping circuit 291 may then assign a new address to write/read data to be stored in one or more memory modules. Durability circuit 293 may also generate control signals indicating that certain memory locations have not been written to as much as others so mapping circuit 291 enables distribution of stored write/read data in non-volatile integrated circuit memory devices.

Defect circuit 294 is responsible for determining whether one or more memory locations are defective or are not accurately storing and outputting information. In an embodiment, defect circuit 294 stores a plurality of test values 294a that are written to one or more memory locations in another memory module in response to a control signal from control circuit 290. The stored test values in the other memory module then may be read back to IC buffer device 200a and compared to the stored plurality of test values 294a by a compare circuit. The compare circuit outputs a signal that indicates a memory location is defective in response to the comparison. A control signal then may be output to the mapping circuit 291 so that further remapping of write/read data will not include the identified defective memory location. In an embodiment, defect circuit 294 stores the addresses of the defective memory locations that may be accessed by control circuit 290 and/or mapping circuit 291. In an embodiment, the plurality of test values 294a are generated by a pseudo-random number generator, provided by controller 110 as a test pattern, or are obtained by reading the contents of another memory module.

In an alternate embodiment, defect circuit 294 includes a sense circuit to sense and compare a current/voltage from a memory location with a stored value representing a current/voltage in order to determine whether a memory location is defective.

In various embodiments, IC buffer device 200a including HRCH circuit 190 operates in different modes of operation. In a first mode of operation, IC buffer device 200a stores read/write data to be accessed by another memory module and/or a controller. In a second mode of operation, IC buffer device 200a assigns an address for the read/write data in another memory module and transfers the data and address to the another memory module which then stores the read/write data.

Clock circuit 270 includes one or more clock alignment circuits for phase or delay adjusting internal clock signals with respect to an external clock. Clock alignment circuits may utilize an external clock from an existing clock generator, such as clock source 130, or an internal clock generator to provide an internal clock, to generate internal synchronizing clock signals having a predetermined temporal relationship. In an embodiment, clock circuit 270 includes a phase lock loop circuit or a delay lock loop circuit. In an embodiment, clock alignment circuits provide an internal clock signal having a temporal relationship with transferred or received control information, read data and/or write data.

In embodiments, transmitters in interfaces 220a-b (as well as interface 210) transmit a differential signal that includes encoded clock information and receivers receive a differential signal that includes encoded clock information. In an embodiment, clock circuit 270 extracts the clock information encoded with the data received by the receiver. Furthermore, clock information is encoded with data transmitted by the transmitter. For example, clock information may be encoded onto a data signal, by ensuring that a minimum number of signal transitions occur in a given number of data bits.

Serial interface 274 is an interface to receive/transmit serial information from or to a controller 110, another IC buffer device or other configuration circuit in embodiments. The serial information may include initialization values/signals for IC buffer device 200a or a memory module. In an embodiment, serial interface 274 is used by a controller 110 to store and/or read values in HRCH circuit 190, such as one or more write threshold values 293a and/or test values 294a.

Figure 2B:
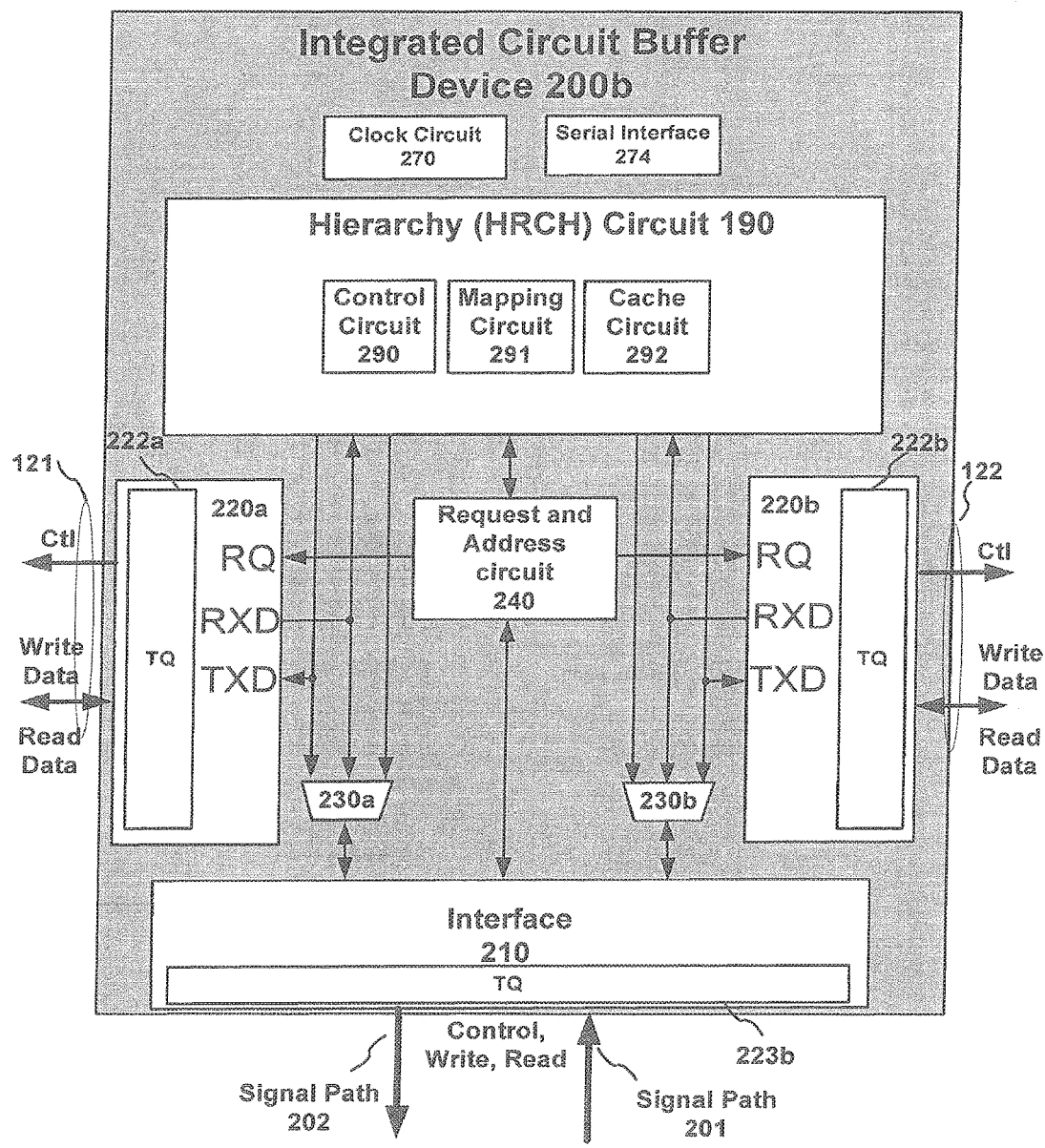
FIG. 2B illustrates an integrated circuit buffer device similar to FIG. 2A.

FIG. 2B illustrates a buffer IC 200b similar to the buffer IC 200a shown in FIG. 2A, but for use with volatile memory modules 118 (FIG. 1). Most of the circuitry in the two buffer ICs is similar, and for reasons of brevity will not be re-described. However, certain modifications to the circuitry may be employed, such as the omission of the durability and defect circuits 293a and 294a (FIG. 2A). Additionally, the transaction queues and the mapping circuit handle data mapping differently than that employed by the nonvolatile module buffer IC 200a.

Mapping circuit 291 is generally configured to direct data to and from interface 220 to all of the devices in parallel and a similar address is sent to all or most of the devices at the same time, many deices are selected by a single transaction. Interfaces 220a-b are shown as separate interfaces but could be combined. They contain transaction queues 222a-b that are used to store data that is being sent to or received from the volatile memory devices. In the case of buffer 200b being applied to volatile memory devices like a DRAM, the transaction queues store a transaction that is directed to and distributed to numerous devices. In this case the combined bandwidth of the devices are accessed in parallel to maximize the bandwidth of the transaction. Data being sent to and from the memory devices is forwarded to a transaction queue 223b in interface 210 before being sent to the upstream and downstream serial interfaces. Similarly transactions that are received serially from signal path 201, are stored in the transaction queue 223b and then forwarded to transaction queues in 222a-b before being sent to the memory devices. In this organization a single transaction on the upstream or downstream links in interface 210 accesses multiple memory devices when it is read or written from memory.

As noted above, flash memory devices and DRAM memory devices have many different characteristics. A further difference involves how data write operations are carried out in the device.

FIG. 3A illustrates an example of the relative data mapping between a DRAM-based FBDIMM module 318 versus a flash-based FBDIMM module 320. In the DRAM-based FBDIMM memory module, DRAM devices 303a-h on the module generally define the data bus width. The width, in turn, denotes the number of bits capable of being written to all the DRAMs simultaneously at each clock edge. Each simultaneous write is carried out at the same address in each DRAM, as shown figuratively by the shaded areas in the volatile devices 303a-h of FIG. 3A. Consequently, for each clock cycle, a portion of the data is written to each DRAM. The buffer IC 325 provides deserialization circuitry (not shown) to convert the serial stream received from the upstream serial link 340a or downstream serial link 350b into parallel data streams for transmission along parallel data paths 328a-h to the individual DRAM devices.

While the simultaneous parallel write scheme works well in a DRAM-based memory module, a variety of reasons render such a method for flash-based modules impractical. Flash devices often erase and reprogram in units of memory called blocks. Moreover, in order to store, or write data to a flash device, the block must be empty, or erased. Consequently in most cases, an erase operation precedes a write operation. Further, as noted above, flash devices usually have a limited write endurance.

Further referring to FIG. 3A, the flash-based FBDIMM module 320 includes a buffer IC 326 that remaps serialized data received from the downstream serial link 340b in a way that stores the data within one or more designated blocks 360 (shown as a shaded block), utilizing a minimum number of devices. This ensures that the write operations maximize the available storage utilization per block, and minimizes the number of write operations affecting the endurance of all the devices. This mapping may also work in the reverse direction along the upstream path between the two modules. In such a situation, data from a given block would be remapped to the multiple DRAMs similar to that shown.

FIG. 3B illustrates address mapping 362 between a first hierarchy address space 363 and a second hierarchy address space 364. In an embodiment, the first address space 363 corresponds to an address space (or amount of addressable memory locations) in hierarchy 101 (having volatile integrated circuit memory devices) and hierarchy address space 364 corresponds to the address space in hierarchy 102 (having nonvolatile ICs). Hierarchy address space 363 includes at least addressable memory locations 366a-n and hierarchy address space 364 includes at least addressable memory locations 368a-t. In an embodiment, hierarchy address space 364 is significantly larger than hierarchy address space 363. As described herein, circuits and/or executable instructions map or assign data to either hierarchy address space 363 or hierarchy address space 364. In an embodiment, associated data may be read and/or write data that was at one time assigned an address in one of the hierarchy address spaces 363 or 364 and was then remapped or assigned a different address at a different memory location in the previously assigned hierarchy address space or to a different memory location in a different hierarchy address space. In an embodiment, a memory location illustrated in FIG. 3B corresponds to a block or group of contiguous memory locations.

For example, data stored or to be stored at memory location 364a is mapped or assigned an address to memory location 363b and stored at memory location 363b. Similarly, data stored or to be stored at memory location 363n is mapped an address to memory location 364t and stored at memory location 364t.

Data having an assigned memory location 364e may also be reassigned a memory location 364s and stored at memory location 364s in hierarchy address space 364. The reassigning and storing of data in hierarchy address space 364 may occur when a predetermined number of write operations have occurred at a particular memory location and/or when a particular memory location is determined to be defective or unreliable.

FIG. 4 illustrates a controller 110, as shown in FIG. 1, with HRCH circuit 180. HRCH circuit 180 operates similar to HRCH circuits 190 shown in FIG. 2A and FIG. 2B. Controller 110 also includes an interface 401, similar to interface 310, for transferring control information and read/write data on signal path 140a. Controller 110 also includes a clock circuit 403, also similar to clock circuit 370, used in synchronization and transferring control and read/write data. Serial interface 402 is used along with serial interface 374 in IC buffer devices 125a-b and 126a-b to provide serial information between controller 110 and IC buffer devices 125a-b and 126a-b.

In an embodiment, control circuit 390 of controller 110 or IC buffer device 300 reads information from a storage circuit, such as a SPD device, that indicates the number and types of hierarchies in system 100. Control circuit 390 then may generate the appropriate control signals in response to the information read from a SPD device.

In operation, the system described above may establish hierarchies based on module position (e.g. upstream versus downstream) and device type (e.g. volatile versus nonvolatile). When coupled with an FBDIMM-like infrastructure, including upstream and downstream paths, such an architecture takes advantage of volatile and nonvolatile memory benefits, while avoiding issues of non-compliance.

FIGS. 5A-D illustrate methods 500, 510, 520, and 530 for operating system 100 shown in FIG. 1. By taking advantage of the daisy-chained point-to-point link architecture described above, many of the methods described below involve multiple operations carried out concurrently. Moreover, in embodiments, logic blocks illustrated in FIGS. 5A-D represent the operation of hardware (e.g., circuits), software (executable instructions), or a user, singly or in combination. For example, HRCH circuits shown in FIG. 1, singly or in combination, with other circuits may perform the operations. Other logic blocks that are not shown may be included in various embodiments. Similarly, logic blocks that are shown may be excluded in various embodiments. Also, while methods 500, 510, 520, and 530 are described in sequential logic blocks, operations represented by logic blocks of the methods are completed very quickly or almost instantaneously and may be performed concurrently.

Figure 5A:
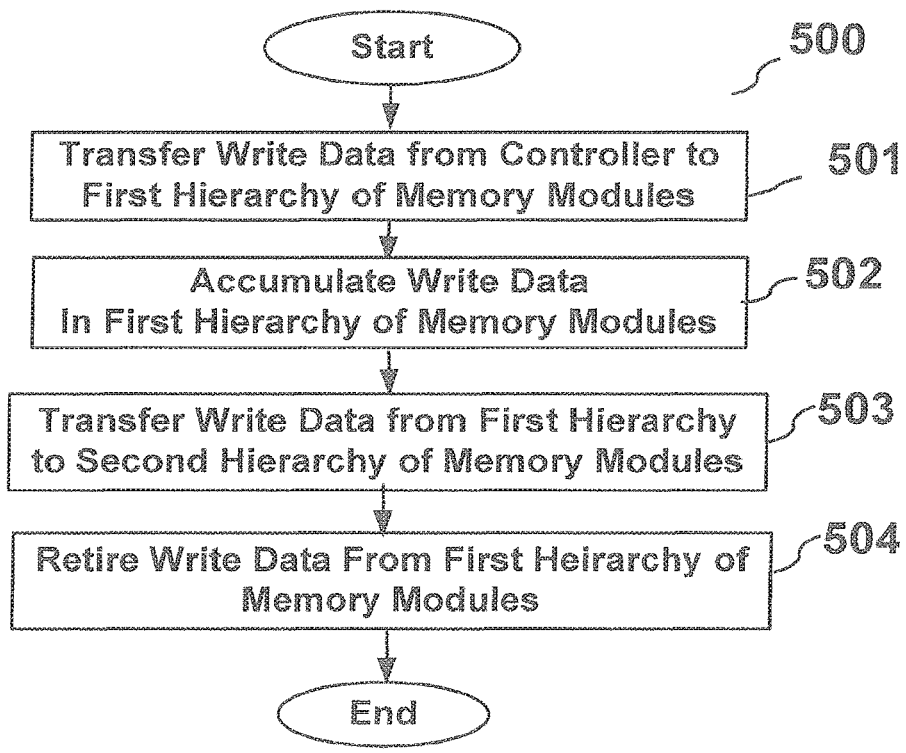
FIG. 5A-D are flow charts that illustrate methods of operating a memory system having a hierarchy of memory modules.

Method 500 illustrated in FIG. 5A involves write data buffering and begins by transferring write data from the memory controller 110 into the first hierarchy 101 of one or more memory modules, at 501. The write data is also accumulated, and may be assembled into a predetermined number of contiguous bit values or a block of write data, in the first hierarchy, at 502. The accumulated write data in the first hierarchy then may be transferred from the first hierarchy of modules to the second hierarchy 102 of one or more memory modules, at 503. Write data stored in the first hierarchy may then be retired, at 504. In method 500, the first hierarchy acts as a write cache for the second hierarchy. This is important since the write latency associated with the nonvolatile memory devices in the second hierarchy modules may be on the order of milliseconds. By caching the write data in the first hierarchy while the data transfers from the first to the second hierarchy, the controller may concurrently perform other operations without the need to wait for the second hierarchy module(s).

Figure 5B:
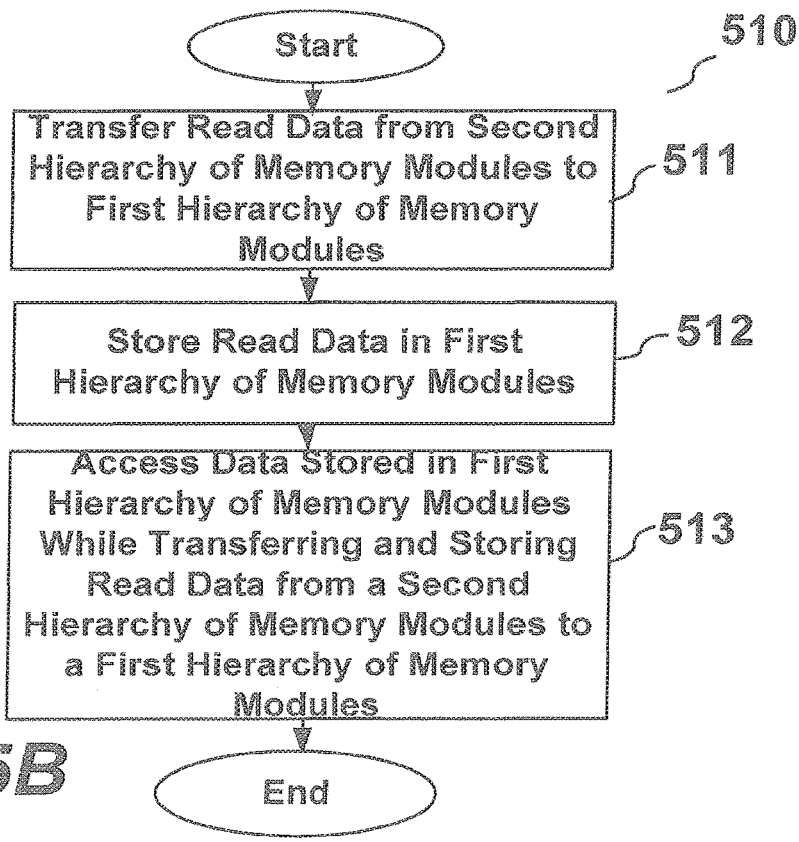

FIG. 5B illustrates a method of read data caching 510 wherein the first hierarchy 101 acts as a read cache for read data (with respect to the controller 110) for the second hierarchy 102. Method 510 begins by assembling read data into a predetermined number of contiguous bit values or a block of read data, then transferring the read data from the second hierarchy, to the first hierarchy, at 511 and 512. The first hierarchy is concurrently able to perform write and read operations concurrently with respect to the controller while the block of read data is being transferred from the second hierarchy to the first hierarchy, at 513. Another beneficial method provided by the hierarchical system described herein involves write data merging. In some instances, a portion of some desired data may be stored in a module within the first hierarchy 101, while another portion is already stored in a module within the second hierarchy 102. Any writes to a block in the second hierarchy (with nonvolatile devices) involve first erasing the contents of the entire block. Consequently, in order to avoid losing the original contents of the block, a form of "read-modify-write" series of steps may be employed as shown in FIG. 5C.

Figure 5C:
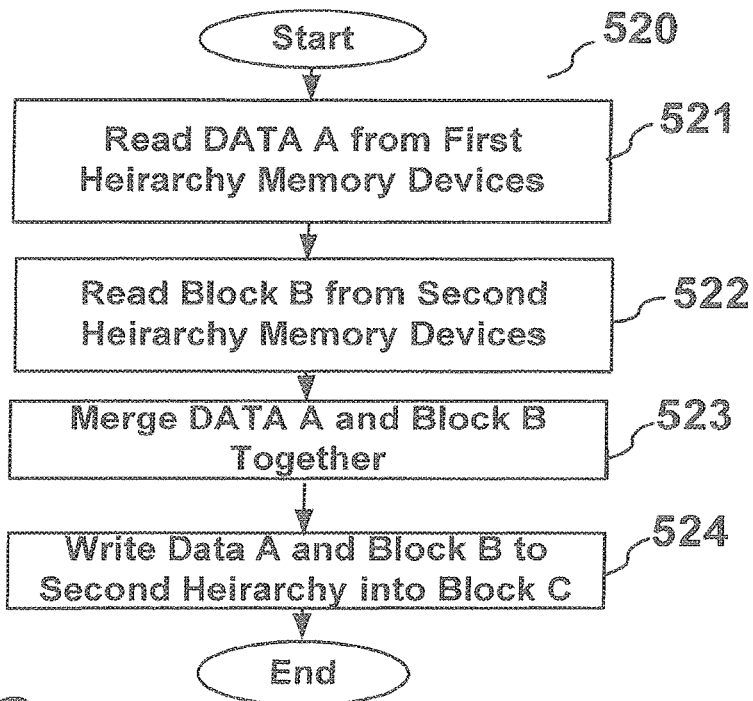

Further referring to FIG. 5C, a method of write data merging 520 involves first reading desired data "DATA A" from a volatile memory device in the first hierarchy 101 of modules, at 521. The data may be temporarily stored in one of the volatile memory module buffer ICs 125 or nonvolatile memory module buffer ICs 126. A block of desired data "BLOCK B" from a nonvolatile device is then read from a memory module in the second hierarchy 102, as shown in step 522, and temporarily stored in the same buffer IC that stores the data DATA A. The data DATA A and BLOCK B are then merged together by the buffer circuitry, at step 523. The merged data "DATA A" and "BLOCK B" is then written back to the second hierarchy into a single block of data "BLOCK C", at 524.

Figure 5D:
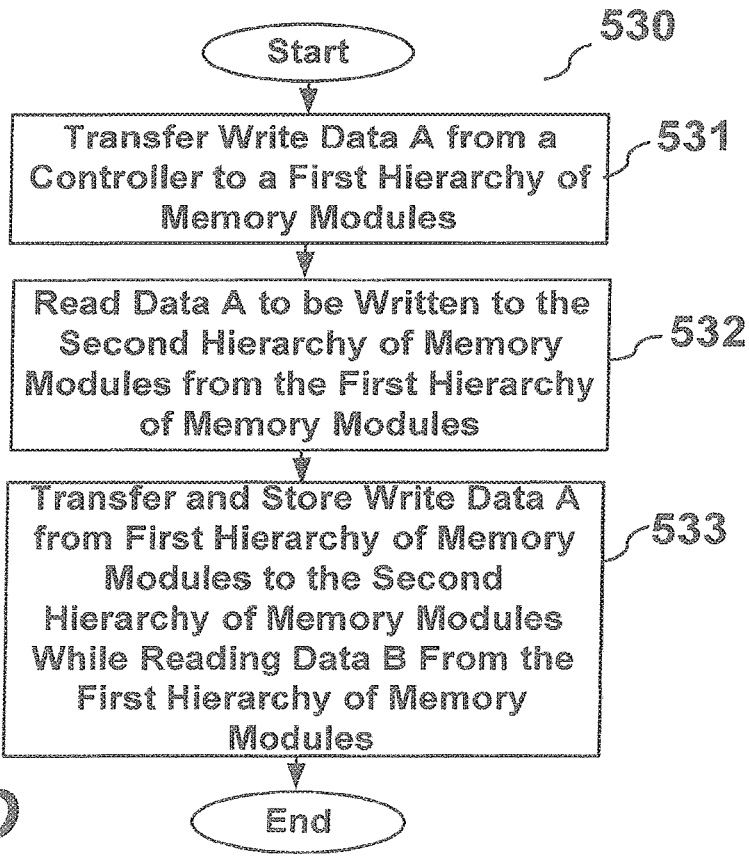

FIG. 5D illustrates a method 530 that begins at 531, by transferring write data A to the first hierarchy 101, where the write data A is stored or cached into a block of write data before the block of write data is written to the second hierarchy 102. At 532, the cached block of write data A in the first hierarchy is accessed. The cached block of write data A is then transferred, at 533, from the first hierarchy to the second hierarchy and stored in the second hierarchy while data B in the first hierarchy is concurrently accessed, such as through a read operation. While FIG. 5D illustrates one embodiment of a method involving concurrent operations, various combinations of concurrent operations are possible due to the daisy-chained upstream and downstream point-to-point links 140a-n and 150a-n that interconnect the controller and buffer devices 110, 125 and 126. For example, read and/or write operations may be carried out between the controller 110 and the first hierarchy of memory devices concurrently with write and/or read operations carried out between the first and second level memory hierarchies.

Returning to the embodiments illustrated in FIG. 1, memory modules 120a-d include a substrate with interfaces 123a-d having a plurality of conducting contacts, such as pins and/or balls, for coupling to signal paths 140a-d. In an embodiment, a plurality of contacts, solder balls or pins are included in an interface to provide electrical connections between an interface and a memory module substrate. In an embodiment, the interface may be removable from a connector or substrate, such as a printed circuit board. In an embodiment, controller 110, integrated circuit memory devices 103a-p and 104a-p, and IC buffer devices 125a-b and 126a-b are separately housed integrated monolithic circuits and/or combined in multiple package (e.g., memory devices and a buffer device in a single package). The packages may be disposed on one or more substrates.

In an embodiment, one or more signal paths 140a-d are point-to-point links that denotes one or a plurality of signal lines, each signal line having only two transceiver connection points, each transceiver connection point coupled to a transmitter, a receiver or transceiver circuit. For example, a point-to-point link may include a transmitter coupled at or near one end and a receiver coupled at or near the other end.

In embodiments, one or more signal paths 140a-d may include different types of bus or point-to-point link architectures. In embodiments, signal paths may also have different types of signaling and clocking type architectures. Embodiments having different link architectures include simultaneous bi-directional links, time-multiplexed bi-directional links and multiple unidirectional links. Voltage or current mode signaling may be employed in any of these link or bus architectures. In an embodiment, signal paths 140a-d include a serial data bus, such as an SMBus. A serial bus may couple controller 110 to one or more IC buffer devices 125a-b and 126a-b via serial interface 474.

In an embodiment, one or more memory modules 120a-d are dual-in-line memory modules ("DIMM") having a standard DIMM form factor. In an embodiment, a memory module may be included in a single unitary package, as in a "system in package" ("SIP"). In one type of SIP embodiment, a memory module may include a series of integrated circuit dies (i.e., memory devices and buffer devices) stacked on top of one another and coupled via a conductive interconnect. Solder balls or wire leads may be employed as the connector interface such that the memory module may be fixedly attached to a printed circuit board substrate. A connector interface may also be of a physically separable type that includes, for example, male and female portions such that a memory module is detachable from the rest of a system. Another SIP embodiment may include a number of memory devices and a buffer device disposed, in a two dimensional arrangement, on a common substrate plane and situated inside a single package housing.

In embodiments shown in FIG. 1, integrated circuit memory devices 103a-p and 104a-p include different types of integrated circuit memory devices. For example, integrated circuit memory devices 103a-p may be volatile integrated circuit memory devices while integrated circuit memory devices 104a-p may be non-volatile integrated circuit memory devices. A volatile integrated circuit memory device includes a plurality of memory cells where stored information is lost when power is removed from the device in an embodiment. In contrast, a non-volatile integrated circuit memory device includes a plurality of memory cells where information is maintained when power is removed from the device in an embodiment.

Types of volatile memory devices include, but are not limited to, dynamic random access memory ("DRAM"), molecular charge-based (ZettaCore) DRAM, floating-body DRAM and static random access memory ("SRAM"). Particular types of DRAM include double data rate SDRAM ("DDR"), or later generation SDRAM (e.g., "DDR2" or "DDR3") as well as XDR™ DRAM or DIRECT RAMBUS® DRAM ("DRDRAM").

Types of non-volatile memory devices include, but are not limited to, types of electrically erasable program read-only memory ("EEPROM"), FLASH (including NAND and NOR FLASH), ONO FLASH, magnetoresistive or magnetic RAM ("MRAM"), ferroelectric RAM ("FRAM"), holographic media, Ovonic/phase change, Nanocrystals, Nanotube RAM (NRAM-Nantero), MEMS scanning probe systems, MEMS cantilever switch, polymer, molecular, nano-floating gate and single electron.

One characteristic of some types of non-volatile memory devices is that although it can be read or programmed/written a byte or word at a time in a random access manner, it must be erased a block at a time. Starting with a freshly erased block, any byte within the block can be programmed. However, once a byte has been programmed, it cannot typically be changed again until the entire block is erased. For example, NOR FLASH memory devices may offer random-access read and programming operations, but typically cannot offer random-access rewrite or erase operations.

An integrated circuit memory device may include one or more storage arrays (or banks) of two dimensional memory cells that may be individually accessed (via word and bit lines) by a row and decoder circuit along with a plurality of sense amplifiers. Various amounts of voltages or currents may be applied to one or more memory cells in a storage array to program (write), read and/or erase a memory cell storing a voltage value corresponding to a logical value (e.g., logical 1 or 0).

In embodiments shown in FIG. 1, controller 110 is a master device, which may be an integrated circuit device that contains other interfaces or functionality, for example, a Northbridge chip of a chip set. The master device may be integrated on a microprocessor or a graphics processor unit ("GPU") or visual processor unit ('VPU"). The master device may be implemented as a field programmable gate array ("FPGA"). System 100 may be included in various systems or subsystems such as servers (e.g., a blade server), personal computers, graphics cards, set-top boxes, cable modems, cell phones, game consoles, digital television sets (for example, high definition television ("HDTV")), fax machines, cable modems, digital versatile disc ("DVD") players or network routers.

In embodiments shown in FIG. 1, system 100 may be used in a server used in executing or functioning as a search engine that provides search results including hyperlinks to web sites (or pages), images and/or videos stored on the Internet in response to entering key words. In a search engine embodiment, information that is often retrieved may be stored in hierarchy 101 (e.g., recent search results) while information that is less often retrieved (e.g., indexes) may be stored in hierarchy 102.

Signals described herein may be transmitted or received between and within controllers/memory modules/devices/circuits by electrical conductors and generated using any number of signaling techniques including without limitation, modulating the voltage or current level of an electrical signal. The signals may represent any type of control and timing information (e.g., commands, address values, clock signals, and configuration information) as well as data. In an embodiment, control, address and or data information is included in a request packet that represents one or more signals asserted at particular bit windows on particular signal lines. In an embodiment, a request packet is provided from a controller to one or more memory modules and between memory modules.

In embodiments, a signal path is media that transfers a signal, such as an interconnect, conducting element, contact, pin, region in a semiconductor substrate, wire, metal trace/ signal line, or photoelectric conductor, singly or in combination. In an embodiment, multiple signal paths may replace a single signal path illustrated in the figures and a single signal path may replace multiple signal paths illustrated in the figures. In embodiments, a signal path may include a bus and/or point-to-point connection. In an embodiment, a signal path includes control and data signal lines. In an alternate embodiment, a signal path includes only data signal lines or only control signal lines. In still other embodiments, signal paths are unidirectional (signals that travel in one direction) or bidirectional (signals that travel in two directions) or combinations of both unidirectional signal lines and bidirectional signal lines.

It should be noted that the various circuits disclosed herein may be described using computer aided design tools and expressed (or represented) as data and/or instructions embodied in various computer-readable media, in terms of their behavior, register transfer, logic component, transistor, layout geometries, and/or other characteristics. Formats of files and other objects in which such circuit expressions may be implemented include, but are not limited to: formats supporting behavioral languages such as C, Verilog, and HLDL; formats supporting register level description languages like RTL; formats supporting geometry description languages such as GDSII, GDSIII, GDSIV, CIF, MEBES; and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described circuits may be processed by a processing entity (e.g., one or more processors) within the computer system in conjunction with execution of one or more other computer programs including, without limitation, netlist generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

The functions of circuits described herein may also be replaced partially or wholly with computer/processor executable instructions (or software) stored and executed in for example system 100.

The foregoing description of the preferred embodiments has been provided for the purposes of illustration and description. It is not intended to be exhaustive or to limit the embodiments to the precise forms disclosed. Modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A system comprising:
   a plurality of volatile memory devices disposed on a first memory module that is coupled to a memory controller by a first signal path;
   a nonvolatile memory device disposed on a second memory module that is coupled to the first memory module by a second signal path, wherein a memory transaction for the nonvolatile memory device is transferred from the memory controller to at least one of the plurality of volatile memory devices using the first signal path, and wherein data associated with the memory transaction is to be written from the at least one of the plurality of volatile memory devices to the nonvolatile memory device using the second signal path and a control signal; and
   a defect circuit to generate the control signal in view of a detection of a defect in the nonvolatile memory device based on a comparison of a test value read from a memory location to a stored value.

2. The system of claim 1, wherein the defect circuit is further to store an address corresponding to the memory location when the defect is detected.

3. The system of claim 1, further comprising:
   a mapping circuit to receive the memory location and the control signal and to assign a new memory location for the data associated with the memory transaction based on the control signal.

4. The system of claim 1, wherein the test value is associated with a random based number or is based on content of another memory location.

5. The system of claim 1, wherein the memory location is not used to store subsequent data when the comparison of the test value read from the memory location to the stored value indicates the detection of the defect.

6. The system of claim 1, further comprising:
   a clock circuit to generate a clock signal associated with the data that is to be written from the at least one of the plurality of volatile memory devices to the nonvolatile memory device.

7. The system of claim 1, wherein the plurality of volatile memory devices and the nonvolatile memory device are in a daisy-chained configuration.

8. A method comprising:
   receiving a memory transaction for a memory system comprising a plurality of volatile memory devices disposed on a first memory module that is coupled to a memory controller by a first signal path and a nonvolatile memory device disposed on a second memory module that is coupled to the first memory module by a second signal path;
   transferring data associated with the memory transaction from the memory controller to at least one of the plurality of volatile memory devices by using the first signal path;

generating a control signal in view of a detection of a defect in the nonvolatile memory device based on a comparison of a test value read from a memory location of the nonvolatile memory device to a stored value; and transferring data associated with the memory transaction from the at least one of the plurality of volatile memory devices to the nonvolatile memory device by using the second signal path and the control signal.

9. The method of claim 8, further comprising:

storing an address corresponding to the memory location when the defect is detected.

10. The method of claim 8, further comprising:

assigning a new memory location for the data associated with the memory transaction based on the control signal.

11. The method of claim 8, wherein the test value is associated with a random based number or is based on content of another memory location.

12. The method of claim 8, wherein the memory location is not used to store subsequent data when the comparison of the test value read from the memory location to the stored value indicates the detection of the defect.

13. The method of claim 8, further comprising:

generating a clock signal associated with the data that is to be written from the at least one of the plurality of volatile memory devices to the nonvolatile memory device.

14. The method of claim 8, wherein the plurality of volatile memory devices and the nonvolatile memory device are in a daisy-chained configuration.

15. A circuit comprising:

a plurality of volatile memory devices disposed on a first memory module that is coupled to a memory controller by a first signal path;

an interface to a nonvolatile memory device disposed on a second memory module that is coupled to the first memory module by a second signal path, wherein a memory transaction for the nonvolatile memory device is transferred from the memory controller to at least one of the plurality of volatile memory devices using the first signal path, and wherein data associated with the memory transaction is to be written from the at least one of the plurality of volatile memory devices to the nonvolatile memory device using the second signal path and a control signal; and a defect circuit to generate the control signal in view of a detection of a defect in the nonvolatile memory device based on a comparison of a test value read from a memory location to a stored value.

16. The circuit of claim 15, wherein the defect circuit is further to store an address corresponding to the memory location when the defect is detected.

17. The circuit of claim 15, further comprising:

a mapping circuit to receive the memory location and the control signal and to assign a new memory location for the data associated with the memory transaction based on the control signal.

18. The circuit of claim 15, wherein the test value is associated with a random based number or is based on content of another memory location.

19. The circuit of claim 15, wherein the memory location is not used to store subsequent data when the comparison of the test value read from the memory location to the stored value indicates the detection of the defect.

20. The circuit of claim 15, further comprising:

a clock circuit to generate a clock signal associated with the data that is to be written from the at least one of the plurality of volatile memory devices to the nonvolatile memory device.

* * * * *